(12) United States Patent
Hsu et al.

(10) Patent No.: US 7,335,575 B2
(45) Date of Patent: Feb. 26, 2008

(54) SEMICONDUCTOR CONSTRUCTIONS AND SEMICONDUCTOR DEVICE FABRICATION METHODS

(75) Inventors: Louis L. C. Hsu, Fishkill, NY (US); Rajiv V. Joshi, Yorktown Heights, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/347,332

(22) Filed: Feb. 3, 2006

(65) Prior Publication Data

US 2007/0184581 A1 Aug. 9, 2007

(51) Int. Cl.
*H01L 21/30* (2006.01)
*H01L 21/46* (2006.01)

(52) U.S. Cl. ............... 438/459; 438/108; 438/928; 438/960; 438/977; 257/E21.483

(58) Field of Classification Search ................ 438/459, 438/108, 928, 960, 977; 257/E21.483
See application file for complete search history.

(56) References Cited

U.S. PATENT DOCUMENTS 6,674,128 B1 * 1/2004 Fisher ................... 257/347

| 6,693,024 | B2 * | 2/2004 | Lehmann et al. | ........... 438/542 |
| 6,962,855 | B2 * | 11/2005 | Kim et al. | .................. 438/409 |
| 7,132,321 | B2 * | 11/2006 | Kub et al. | ................... 438/172 |
| 2005/0269617 | A1 * | 12/2005 | Hofmann et al. | ........... 257/309 |
| 2006/0292413 | A1 * | 12/2006 | Takaoka | ..................... 429/30 |

* cited by examiner

*Primary Examiner*—Michael Lebentritt
*Assistant Examiner*—Angel Roman
(74) *Attorney, Agent, or Firm*—Jesse L. Abzuq, Esq.; McGinn IP Law Group, PLLC

(57) ABSTRACT

A method of fabricating a semiconductor device includes etching a substrate to form a recess, the substrate being formed on a backside of a semiconductor wafer, forming pores in the substrate in an area of the recess, and forming in the recess a material having a thermal conductivity which is greater than a thermal conductivity of the substrate. In another aspect, a method of fabricating a semiconductor device includes etching a substrate formed on a backside of a semiconductor wafer to form a recess in the substrate, and forming a sputter film in the recess, the sputter film including a first material having a coefficient of thermal expansion (CTE) which is at least substantially equal to a CTE of the substrate, and a second material having a thermal conductivity which is greater than a thermal conductivity of the substrate.

16 Claims, 11 Drawing Sheets

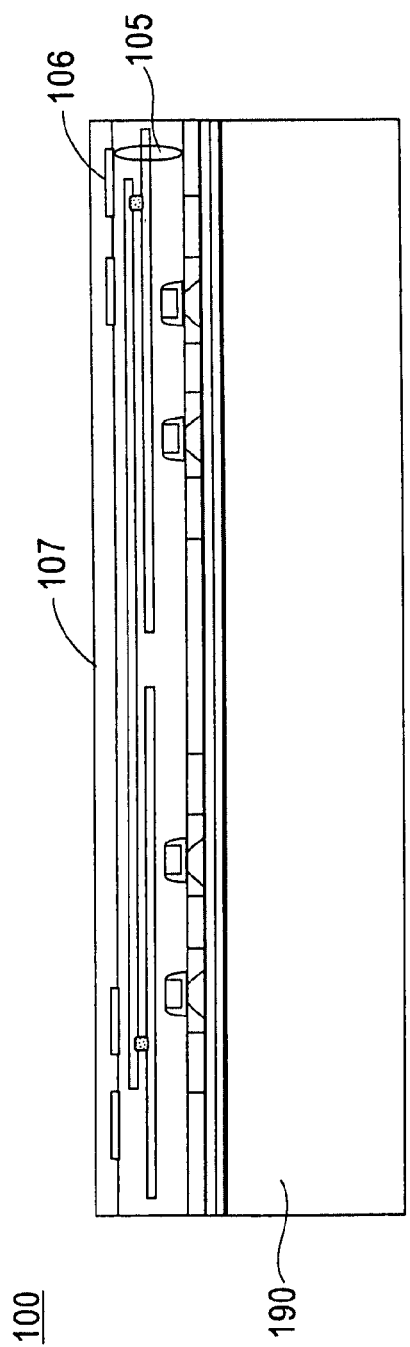
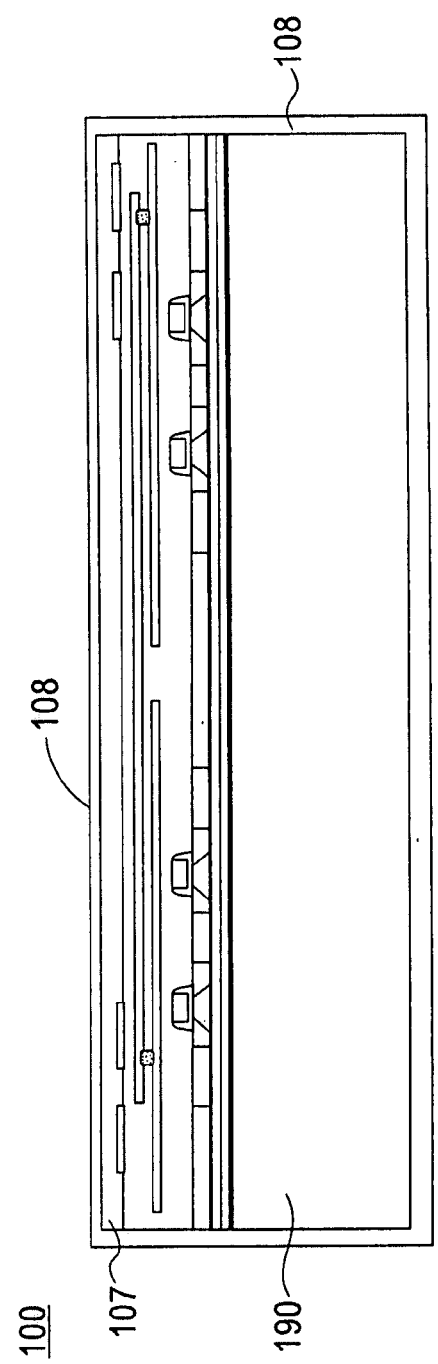
FIG. 4
FIG. 5

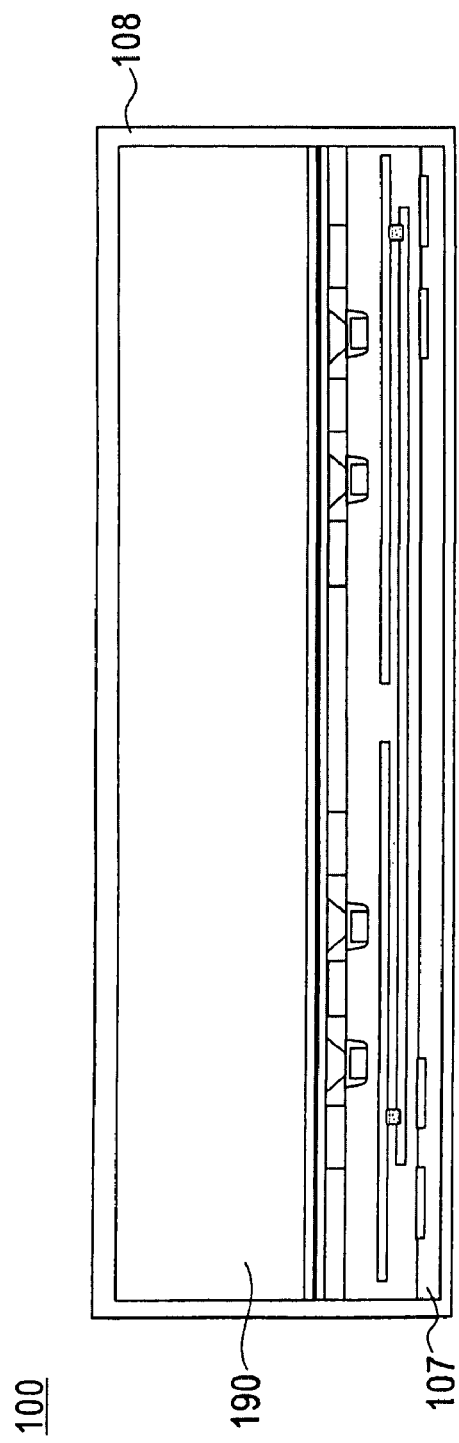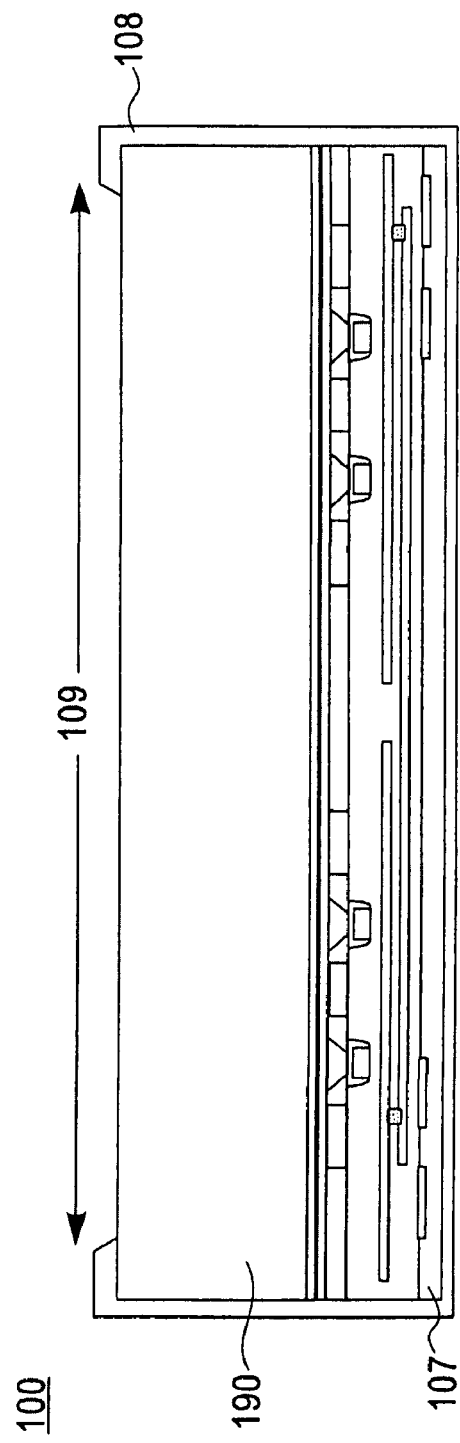

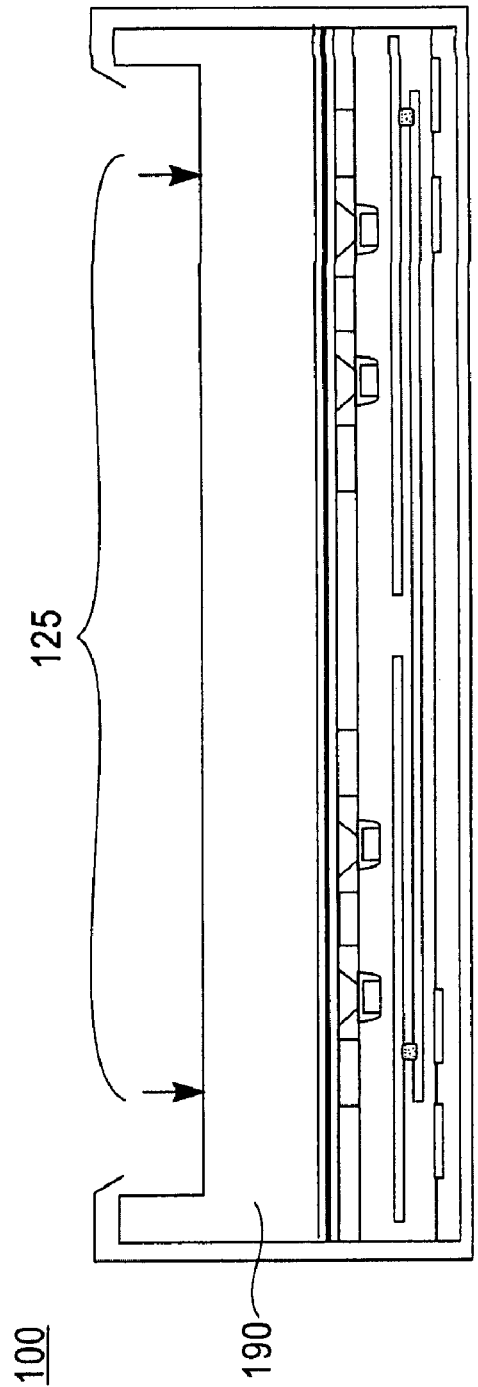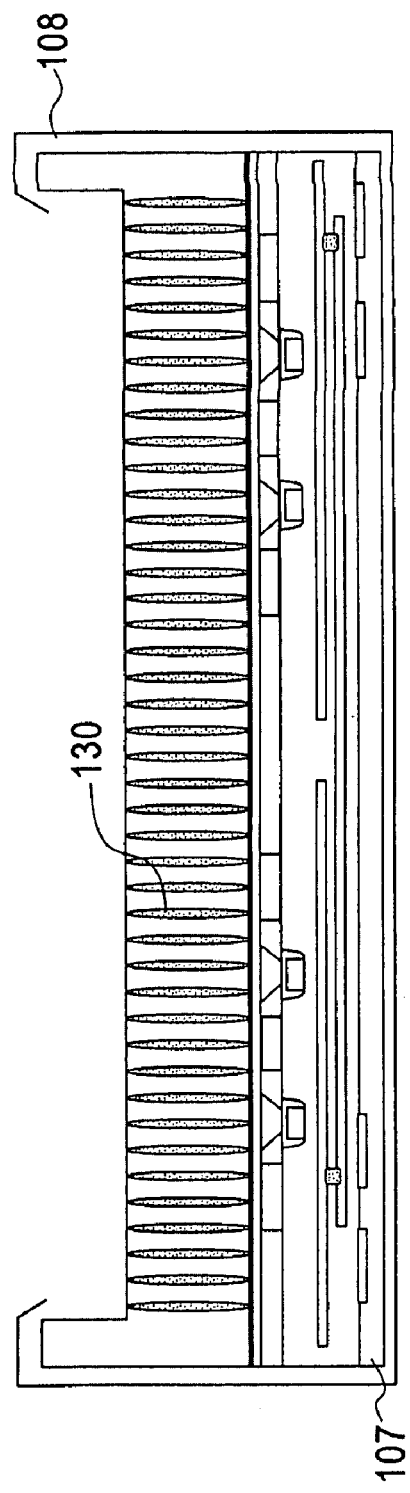

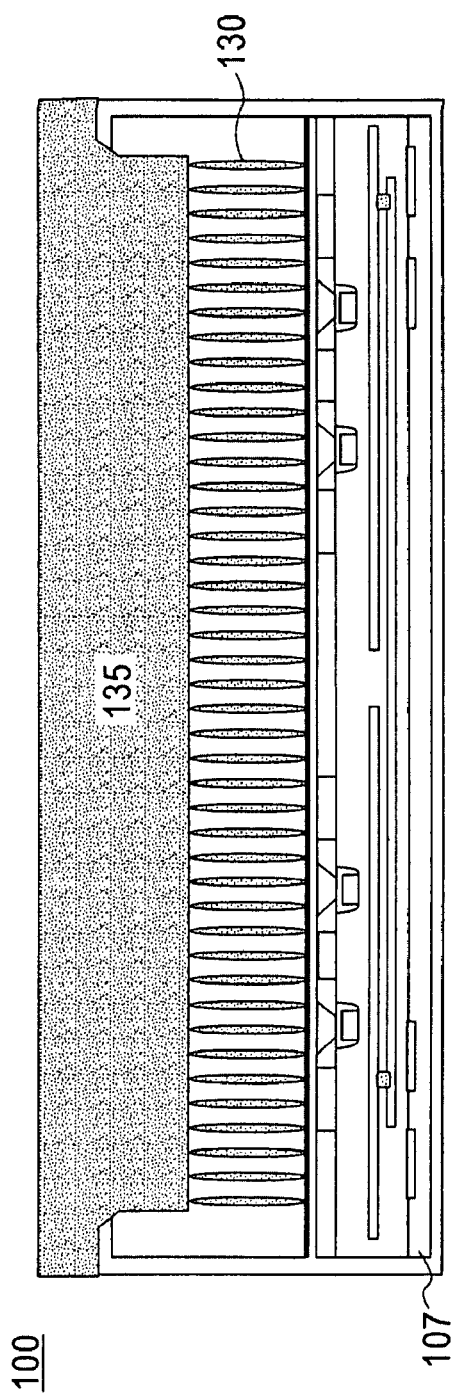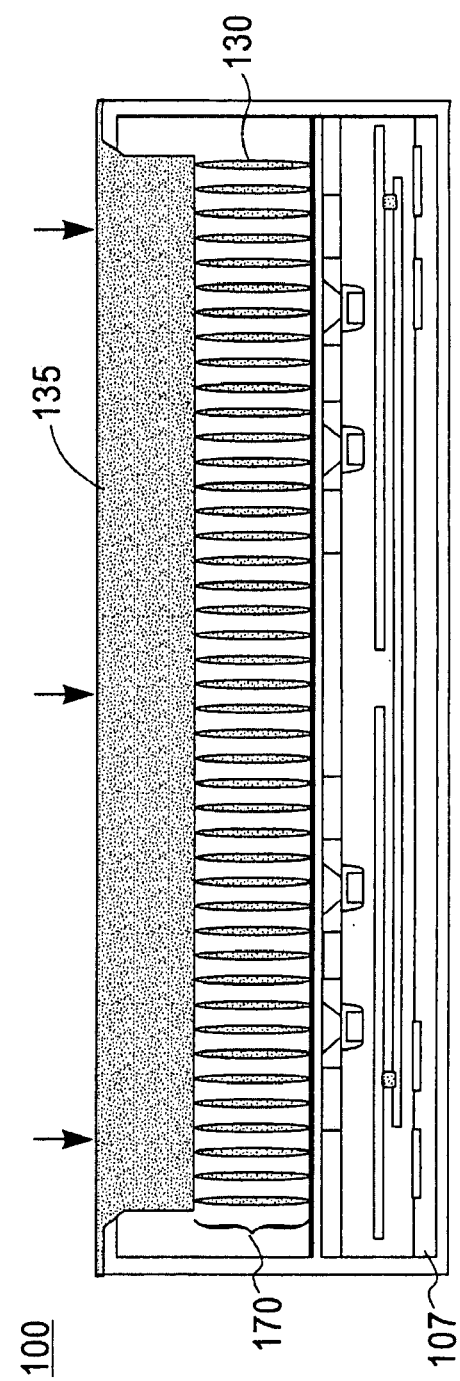

SEMICONDUCTOR CONSTRUCTIONS AND SEMICONDUCTOR DEVICE FABRICATION METHODS

BACKGROUND OF THE INVENTION

1. Field of the Invention

The present invention relates to semiconductor constructions and semiconductor device fabrication methods. More particularly, to a method of fabricating a semiconductor device which may include a material conversion (e.g., wafer backside material conversion).

2. Description of the Related Art

As semiconductor wafers are grown larger and larger, their thicknesses must be proportionally increased in order to provide sufficient physical strength during wafer handling and processing. On the other hand, increasing circuit density means more devices will be packed within a unit area, which demands an increased capability of heat removal from the chip.

In general, heat is dissipated from the front side of the chip via metal interconnects, module balls to cards and boards, etc. In addition, a large amount of the heat must be dissipated from the backside of the chip through a heat sink with or without forced air flow.

Thicker semiconductor wafers (e.g., silicon-on-insulator (SOI) wafers, silicon substrates, etc.) present a challenge on how to effectively remove the heat from the backside of the wafer (e.g., chip). The bottle neck of heat removal is now confined inside the silicon substrate. The situation becomes aggravated when a SOI substrate is used since the thermal resistance of the buried oxide is higher than that of the silicon.

Therefore, it has been recommended to use a thinner buried oxide to minimize the thermal conductivity problem. It has also been suggested to coat the backside of the wafer with a high-thermal conductive material (e.g., deposit a metal on the silicon on the backside of an SOI wafer).

It has also been recommended to thin down the chip by polishing the backside of the chip. The thinning process is carried out when the chip has been fully fabricated, tested sorted, ball attached and cut from the wafer. Each of these individual "good" chips is mounted on a holder and the back side of each chip is subjected to a hostile chemical mechanical polishing.

Clearly, there are many drawbacks to this method of "thinning down" the chip including 1) high cost—one chip will take a few hours to thin down; 2) high risk—a chip can be damaged during polishing; 3) poor control—the final thickness of the die is determined by trial and error. Precision thickness control and in-situ end point detection are difficult and expensive; and 4) poor mechanical strength—thin dies are fragile and prone to be damaged during handling.

SUMMARY OF THE INVENTION

In view of the foregoing and other exemplary problems, disadvantages, and drawbacks of the aforementioned conventional systems and methods, it is a purpose of the exemplary aspects of the present invention to provide a method of fabricating a semiconductor device (e.g., a backside material conversion method) and a semiconductor device fabricated using the method which may provide a wafer (e.g., semiconductor chip) which is relatively inexpensive, has a high mechanical strength, and has an easily controllable thickness.

More specifically, a purpose of an exemplary aspect of the present invention is to convert at least a portion of silicon material on the back of the wafer into a material having a high thermal conductivity (e.g., a high thermal conductive material). Another purpose is to provide a buffered layer between the wafer and the converted layer, where the buffered layer may include a coefficient of thermal expansion coefficient (CTE) which is substantially the same as (e.g., matches) the CTE of the silicon layer.

Another purpose of an exemplary aspect of the present invention is to protect the wafer using a protective coating such that during backside material conversion process damage (e.g., to the finished integrated circuit, metallization, etc.) may be inhibited (e.g., prevented).

An aspect of the present invention includes a method of fabricating a semiconductor device includes etching a substrate to form a recess, the substrate being formed on a backside of a semiconductor wafer, forming pores in the substrate in an area of the recess, and forming in the recess a material having a thermal conductivity which is greater than a thermal conductivity of the substrate.

In another aspect, a method of fabricating a semiconductor device includes etching a substrate formed on a backside of a semiconductor wafer to form a recess in the substrate, and forming a sputter film in the recess, the sputter film including a first material having a coefficient of thermal expansion (CTE) which is at least substantially equal to a CTE of the substrate, and a second material having a thermal conductivity which is greater than a thermal conductivity of the substrate.

Another aspect of the present invention includes a semiconductor device having a substrate formed on a backside of a semiconductor wafer, the substrate including a recess, and a conversion region formed in an area of the recess, the conversion region including at least one of an interdiffusion layer including a material having a thermal conductivity which is greater than a thermal conductivity of the substrate which is formed in pores of the substrate, and a layer of the material formed on the interdiffusion layer, and a sputter film formed in the recess, the sputter film including a first material having a coefficient of thermal expansion (CTE) which is at least substantially equal to a CTE of the substrate, and a second material having a thermal conductivity which is greater than a thermal conductivity of the substrate.

BRIEF DESCRIPTION OF THE DRAWINGS

The foregoing and other exemplary purposes, features, aspects and advantages will be better understood from the following detailed description of the exemplary embodiments of the invention with reference to the drawings, in which:

FIGS. 2-13 further illustrate the method 100 for fabricating a semiconductor device according to the exemplary aspects of the present invention;

DETAILED DESCRIPTION OF THE EXEMPLARY EMBODIMENTS OF THE INVENTION

Figure 1:
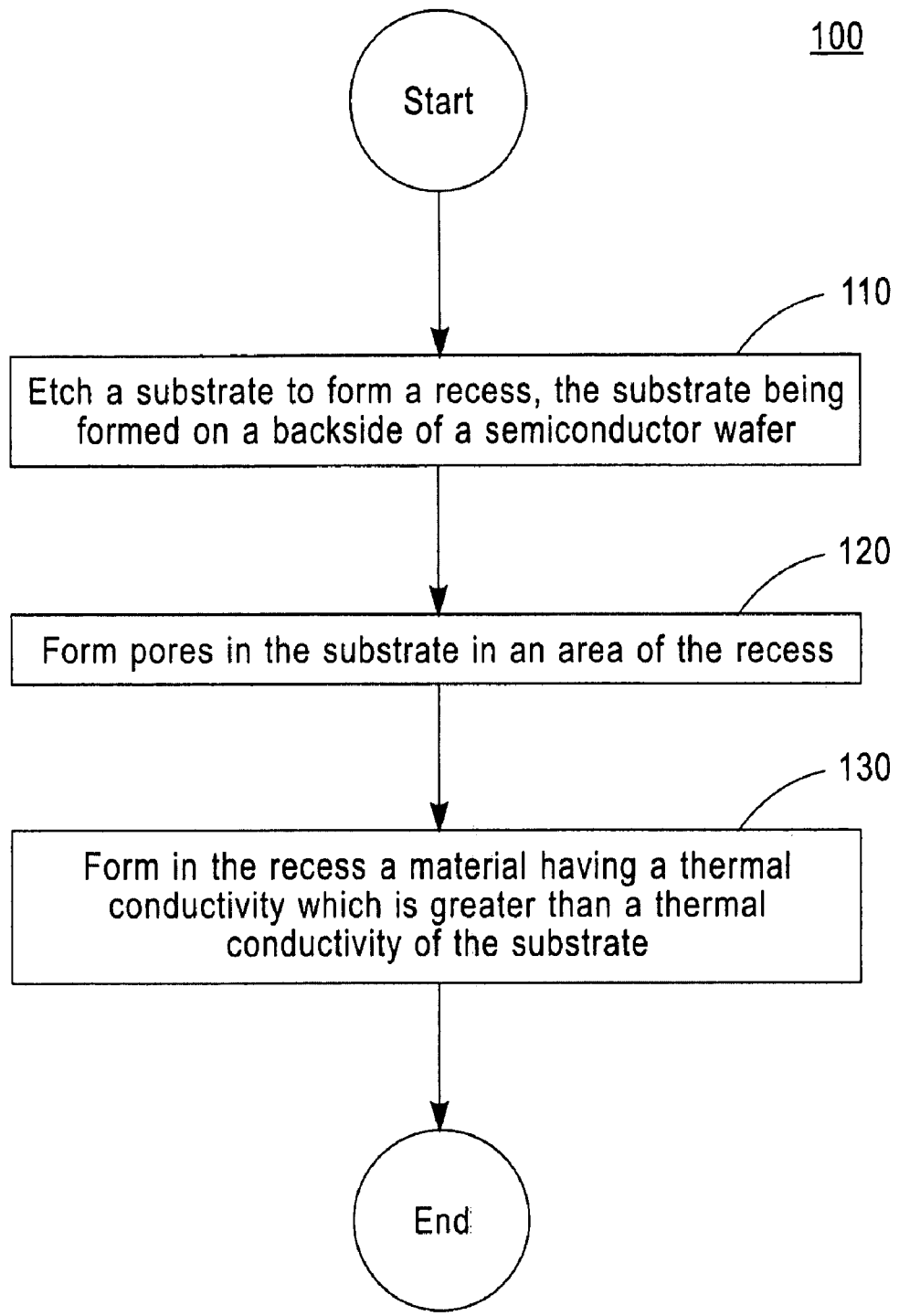
FIG. 1 provides a flowchart illustrating a method 100 of fabricating a semiconductor device according to the exemplary aspects of the present invention.

Referring now to the drawings, FIGS. 1-15D illustrate the exemplary aspects of the present invention.

The inventors have noted that the proposed conventional solutions to the heat removal problem in conventional wafers only solves the problem slightly, since the thermal resistance across the thickness of the silicon chip remains.

Figure 16A:
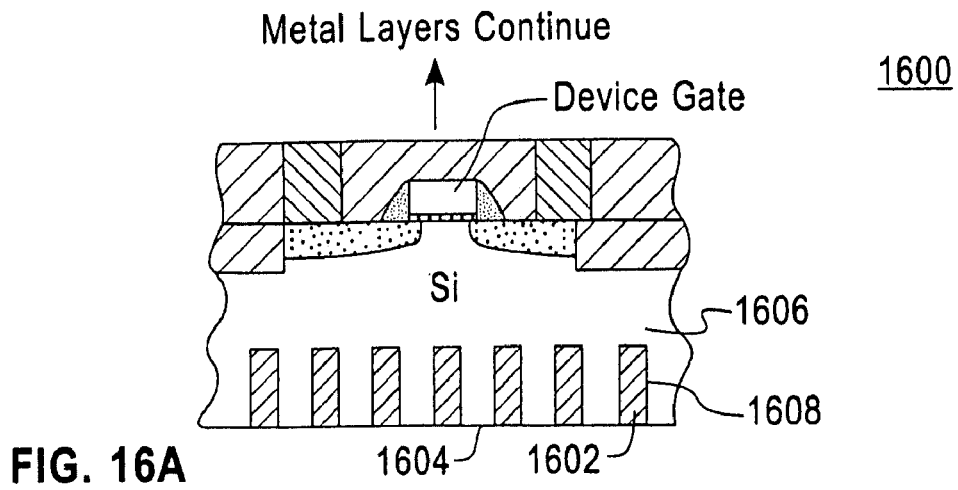
FIG. 16A illustrates a device 1600 formed according to a first related art method.

U.S. Pat. No. 5,955,781 to Joshi et al., "Embedded Thermal Conductors for Semiconductor Chips" (hereinafter "Joshi" or "the '781 patent"), which is commonly assigned with the present application and is incorporated by reference herein, teaches a method of forming thermal conductors embedded within the semiconductor chip structure. As illustrated in FIG. 16A, in the Joshi device 1600 the thermal conductors 1602 (e.g., embedded diamond fins) may be formed in trenches 1608 in the backside 1604 of a substrate 1606. Devices may be formed within the structure adjacent to the thermal conductors 1602 such that during operation, heat produced in the devices may be conducted by (e.g., transferred into and through) the thermal conductors 1602 to reduce an operating temperature of the devices.

Figure 16B:
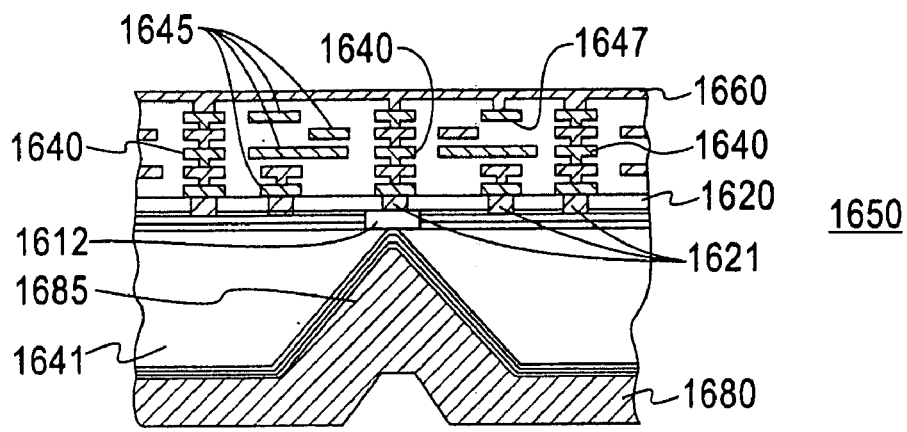
FIGS. 16B-16C illustrate a device 1650 formed according to a second related art method.
Figure 16C:
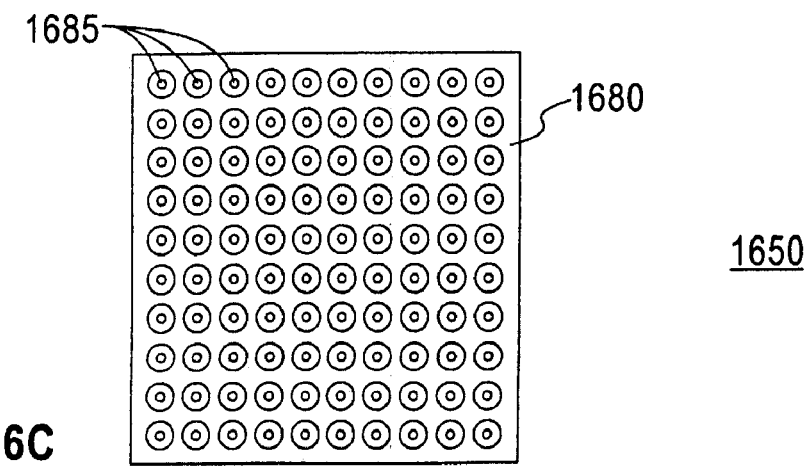

U.S. Pat. No. 6,512,292 to Armbrust et al., "Semiconductor Chip Structures with Embedded Thermal Conductors and a Thermal Sink Disposed over Opposing Substrate Surfaces" (hereinafter "Armbrust" or "the '292 patent"), which is commonly assigned with the present application and is incorporated by reference herein, teaches a method of embedding thermal conductors for removing heat from electrically conductive circuit members. As illustrated in FIGS. 16B-16C, in the Armbrust device 1650, multiple cooling posts 1640, 1645 and 1647 are formed in a first surface of substrate 1641. The posts 1640, 1645 and 1647 are connected to an optional ground plane 1660. In addition, a central post 1640 is coupled through a tungsten stud 1620 and a polysilicon contact 1612 to a via structure 1685 (e.g., copper) which is formed in the substrate 1641 and includes part of a thermal sink 1680.

Overall, there are at least two major aspects which are unique over the conventional arts and which are different from the '781 patent and the '292 patent discussed above. A first aspect is that the present invention may include a method of changing a material on the backside of the wafer uniformly and progressively from a lower Thermal Conductivity (TC) to a higher TC. A second aspect is that the present invention may include a method to ensure that a material of lower TC matches with the material of higher TC in coefficient of thermal expansion (CTE).

As illustrated in FIG. 1, the present invention includes a method 100 of fabricating a semiconductor device. The method includes etching (110) a substrate (e.g., a semiconductor substrate such as a silicon or germanium substrate) to form a recess, the substrate being formed on a backside of a semiconductor wafer, forming (120) pores in the substrate in an area of the recess, and forming (130) in the recess a material having a thermal conductivity which is greater than a thermal conductivity of the substrate (e.g., silicon, germanium, etc.). In an exemplary embodiment of the present invention, the material conversion may be applied to a silicon-on-insulator (SOI) wafer where the buried insulator (e.g., buried oxide) can be used as the conversion stop layer.

Material conversion (e.g., a material conversion process) may include, for example, etching the exposed substrate (e.g., silicon) surface on the backside of the wafer to recess it to at least half of the total wafer thickness, forming a pores in a remaining substrate in an area of the recess to form a porous material layer (e.g., stopping at a buried oxide), depositing a material (e.g., a high thermal conductivity (TC) material) having a thermal conductivity which is greater than a thermal conductivity of the substrate, and forming an alloy or composite of the deposited material and the porous material layer by at least one of annealing, interdiffusion, plating, silicidation, or other low-temperature means.

That is, by the term "converting" or "convert" herein, it may be understood to mean that a portion of the substrate (e.g., silicon) on the backside of the wafer is replaced with another material, such as by removing a portion of the substrate and replacing the removed portion with another material having a thermal conductivity that is greater than the thermal conductivity of substrate (e.g., a high thermal conductivity material).

The final wafer thickness may be substantially the same as (e.g., identical to) a thickness of the original wafer. This may help to maintain mechanical strength.

Figure 2:
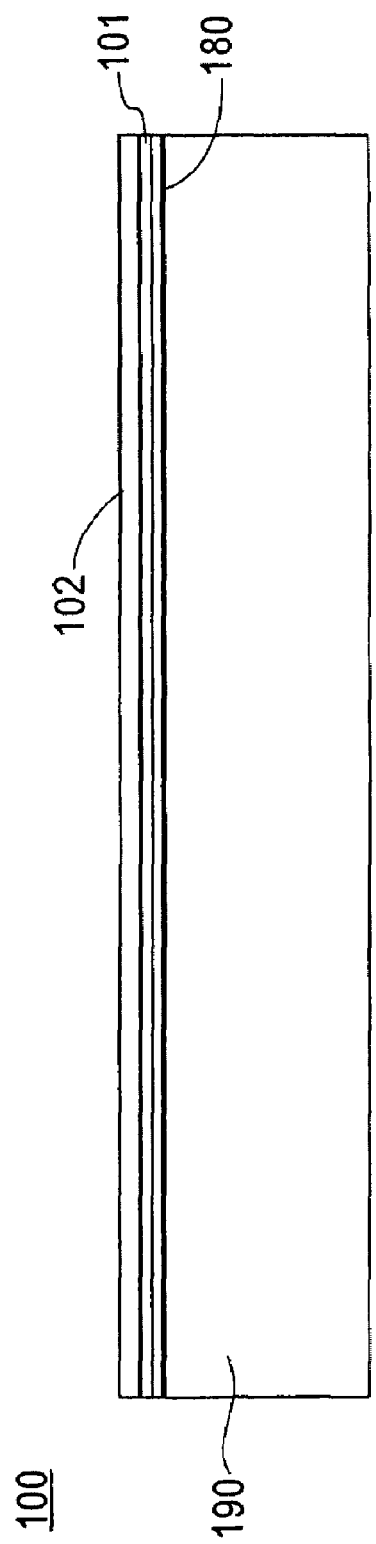

FIGS. 2-13 illustrate a method for fabricating a semiconductor device according to the exemplary aspects of the present invention. Specifically, FIG. 2 illustrates a silicon-on-insulator wafer (e.g., SOI wafer) substrate 100 having a silicon layer 190 (e.g., a thick silicon backside), a silicon layer (e.g., a thin silicon front-side) 102 and a buried insulating layer 101. The buried insulating layer may include, for example, an oxide, a nitride or an oxynitride. It should be noted that although FIGS. 2-13 depict a SOI wafer, other semiconductor substrates (e.g., bulk silicon, bulk germanium, etc.) may also be used.

The SOI wafer 100 may also include a chemical barrier layer 180 (e.g., the dark line in FIG. 2) which may be formed on the backside of the buried insulation 101 and may serve to protect any circuits and devices formed in the front during backside material conversion. A chemical vapor deposition (e.g., CVD) nitride is a good candidate for the barrier layer 180. In the case where the barrier layer 180 is included, the barrier layer 180 (e.g., not the buried insulating layer 101) may act as a conversion stop layer.

Figure 3:
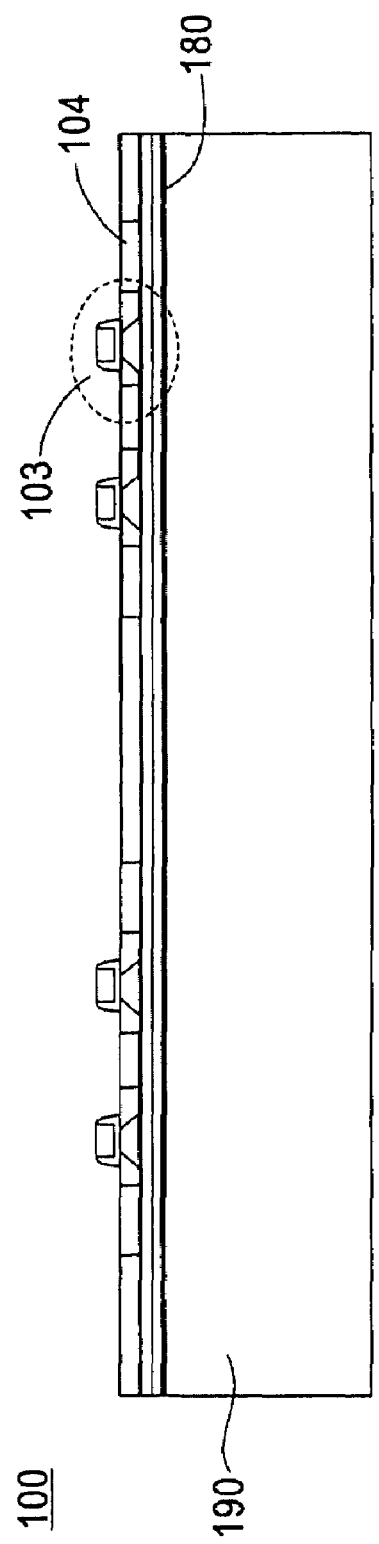

As illustrated in FIG. 3, devices 103 (e.g., transistors such as metal oxide semiconductor (MOS) transistors, resistors, diodes, etc.) and shallow trench isolations 104 may be formed in the thin silicon layer 102. Such devices may be formed, for example, using a semiconductor front-end-of-the-line (FEOL) integration process (e.g., a conventional process) such as implantation, annealing, oxidation, etc., and high-temperature processes (e.g., processes using a temperature over about 800° C.).

As illustrated in FIG. 4, device interconnects (e.g., metallization including metal studs 105, contact pads 106, etc.) may be formed using a standard planar back-end-of-the-line (BEOL) process. A passivation layer (e.g., CVD oxide, etc.) 107 may be formed on (e.g., coated on) the wafer. Most of the BEOL processes can be performed at a relatively lower temperature (e.g., less than 350° C.).

As illustrated in FIG. 5, a protective coating 108 may be formed on the wafer (e.g., the entire wafer) to seal the wafer. The coating 108 may include, for example, an organic coating such as an organic polymer material having a high chemical resistance. This coating 108 may also coat the perimeter of the wafer.

As illustrated in FIG. 6, the wafer 100 may be flipped over (e.g., such that the backside of the wafer is on top) for further processing.

As illustrated in FIG. 7, an opening 109 may be formed in the coating 108 by remove the coating 108 on the backside of the wafer. This can be performed, for example; by an oxygen plasma etching of the coating 108. If necessary, an enhanced coating can be formed on the perimeter (e.g., perimeter of the wafer) after the opening 109 is formed. A purpose of the coating 108 is to help inhibit (e.g., prevent) chemical and/or mechanical damage to the protected areas of the wafer 100 (e.g., the areas which include the devices such as the MOS transistors 103).

As illustrated in FIG. 8, a wet or dry etch can be carried out (e.g., through the opening 109) to form an opening 125 (e.g., a recess or indented part) in the silicon layer 190 (e.g., the thick silicon backside). For example, about one-half (½) of the silicon thickness (e.g., the wafer thickness) may be removed by removing a portion of the wafer 100 to form the opening 125 (e.g., recess).

In addition, the opening 125 may be formed by a high-density plasma etch (e.g., an etch using $Cl_2$ and $SF_6$ gases) which can selectively etch silicon with a high throughput. Further, a timed etch may be used to control the depth of the opening 125, the accuracy of depth control being in the range from about +1% to +5%.

As illustrated in FIG. 9, at least a portion of the silicon layer 190 (e.g., a portion between the opening 125 and the barrier layer 180) may be converted into a porous silicon layer. That is, pores may be formed in the silicon layer 190 in an area of the opening 125. A conventional porous silicon formation process similar to that reported by V. Lehman et al ("Porous silicon formation: a quantum wire effect", *Appl. Phys. Lett.* 58, p. 856 (1991)) may be carried out on the etched surface to form pores (e.g., canals) 130 in the silicon layer. The pores 130 may be, for example, in a range from about 30% to about 80% of the total volume of the silicon layer 190. That is, the porosity of the silicon layer 190 in an area of the recess may be in a range from about 30% to about 80%.

Specifically, the porous silicon includes pores (e.g., canals) 130 which may be formed in the silicon (e.g., single-crystal silicon) layer 190 by performing an ion implantation (e.g., in an area of the recess), and an anodic etching in a fluoride-containing, acidic electrolyte in which the silicon wafer is connected as anode. The size of the pores (e.g., canals) 130 (and hence, the porosity or pore density) may be dependent on the doping concentration during the ion implantation. For example, canals having diameters in a range from about 10 nm to about 100 nm can be formed with a doping concentration more than about $10^{19}/cm^3$. Doping concentration in the range of $10^{15}/cm^3$ and $10^{18}/cm^3$ would yield canals with smaller diameter, (e.g., about 1 to about 2 nm). The barrier layer 180 at the bottom of the buried dielectric may help to inhibit (e.g., prevent) a chemical from penetrating into the front side of the silicon, which may help to avoid damage to the devices and metal interconnects.

As illustrated in FIG. 10, a layer 135 including a material (e.g., a high TC material), having a thermal conductivity which is greater than the substrate (e.g., silicon, germanium, etc.) may be formed in the opening 125. That is, the term "high thermal conductivity material" may be construed herein to mean a material having a thermal conductivity which is at least greater than the thermal conductivity of the substrate (e.g., silicon (TC=148 W/mK), germanium (TC=59.9 W/mK), etc.) formed on the backside of the wafer. Such a material may include, for example, copper (TC=386 W/mK), aluminum (TC=237 W/mK), gold (TC=317 W/mK), tungsten (TC=174 W/mK), CVD diamond (TC=895 W/mK to 2300 W/mK), silicon carbide (TC=300 W/mK), etc. For example, in one exemplary aspect, the material of layer 135 may have a thermal conductivity that is at least two (2) times the thermal conductivity of the substrate. In another exemplary aspect, the material of layer 135 may have a thermal conductivity that is at least three (3) times that of the substrate. In still another exemplary embodiment, the material of layer 135 may have a thermal conductivity which is at least an order of magnitude greater than the thermal conductivity of the substrate. Further, the material of layer 135 (e.g., the high TC material) may also be formed on a portion of the coating 180 which is near the opening 109.

In selecting the high TC material, other criteria may also be considered. For example, it may be preferable that the material has a coefficient of thermal expansion (CTE) which is similar (e.g., substantially equal) to the CTE of the silicon layer 190 (e.g., a matched coefficient of thermal expansion). Further, the material may have a high mechanical strength, be light in weight, and be able to interact with silicon to form an alloy, preferably at low-temperatures (e.g., less than 350° C.) (It should be noted that if the wafer 100 includes a semiconductor substrate other than silicon (e.g., germanium), the high TC material may have a CTE which is substantially the same (e.g., matches) the CTE of that other substrate).

As illustrated in FIG. 11, the high TC material may diffuse into the pores (e.g., canals) 130 in the silicon layer 190. The wafer 100 may be heated to a temperature of not more than 350° C. to assist in the diffusion.

After diffusion, the backside of the wafer 100 is formed by a layer 135 which includes high thermally conductive material, and an interdiffusion layer 170 (e.g., an alloy formed of the portion of silicon layer 109 which includes pores 130 which have therein the high TC material of layer 135). The interdiffusion layer 170 may act as a buffer layer between the silicon layer 190 of the backside of the wafer and the layer 135 and the high TC material layer to help alleviate thermal stresses between the layer 190 and the layer 135.

It should be noted that some materials (e.g., metals such as aluminum, copper, etc.) can easily diffuse into silicon at a temperature of 350° C. or less to form the alloy of layer 170. A higher degree of porosity (e.g., the ratio of the volume of the material's pores to the total volume of the material) would help in forming the alloy of layer 170 (e.g., a high TC material/silicon alloy such as a metal/silicon alloy) more uniformly.

Further, the diffusion of the high TC material into the pores of silicon layer 190 may cause a reduction in the thickness of layer (e.g., metal layer) 135. If needed, a light polish (e.g., chemical mechanical polishing (CMP)) can be carried out to further planarize the back surface, such that the layer 135 is substantially co-planar with the coating layer 108 or such that a thin layer of high-TC material is left on a small portion 108a of coating 108 (e.g., a portion on the backside (e.g., bottom surface) of the wafer 100).

Figure 12:
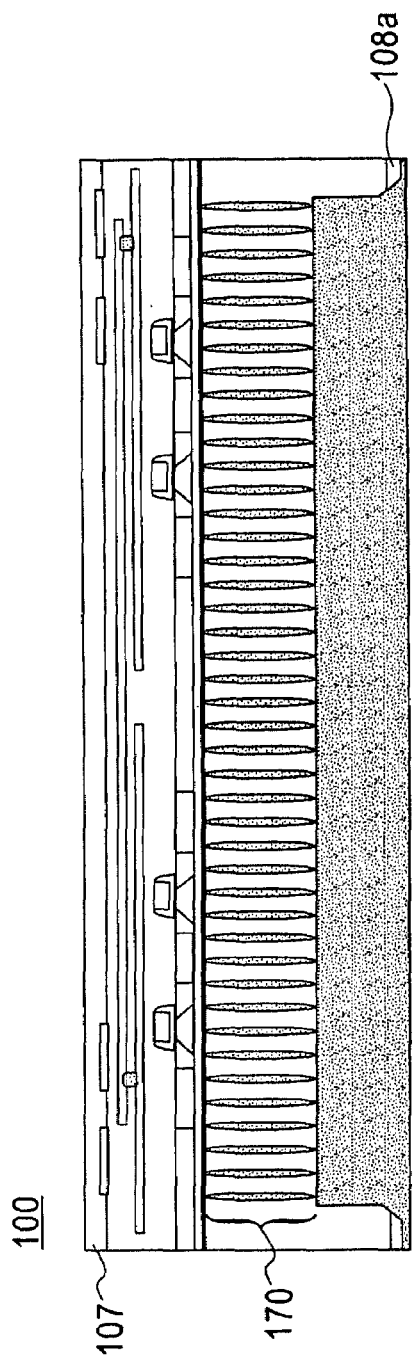

As illustrated in FIG. 12, the coating 108 (e.g., protective film) may be removed (e.g., stripped) off of the wafer 100 (e.g., using an O₂ plasma). Note that the small portion 108a of the coating 108 may remain under the planarized layer 135 on the backside (e.g., bottom surface) of the wafer 100 after the removal process is performed. However, the edges of the wafer may be diced away after the chips are cut out from the wafer.

Figure 13:
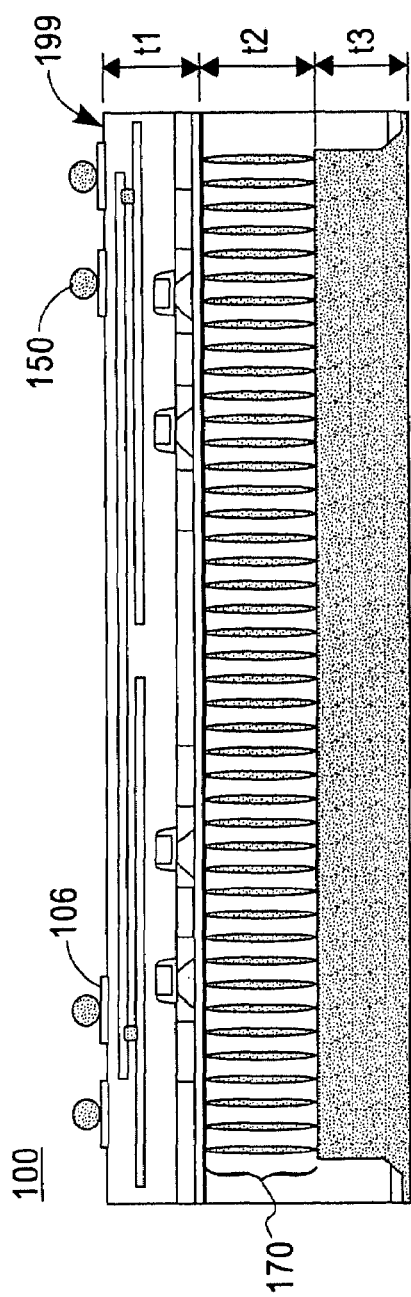

As illustrated in FIG. 13, the passivation layer 107 may be removed and C4 balls 150 (e.g., metal solder balls) can be formed on the front side of the wafer 100 (e.g., on the contact pads 106). In this exemplary aspect illustrated in FIG. 13, the thickness t1 of the front side (e.g., between the uppermost surface 199 of the wafer on which the contact pads 106 and the barrier layer 103) of the wafer 100, and the thickness t2 of the interdiffusion layer 170 (e.g., the porous material layer having the high TC material diffused therein) each can be in the range of about 20 μm (e.g., about 10% to 20% of the total wafer thickness), and the thickness t3 of layer 135 (e.g., the thickness of the high TC material) can be in the range of about 50 μm (e.g., about 60% to 80% of the total wafer thickness).

Further, although FIGS. 2-13 illustrate the wafer 100 as including the barrier layer 180, the device may be formed without the barrier layer, in which case the buried insulating layer 101 may act as the conversion stop layer. In addition, in this case, the thickness t1 may be measured between the uppermost surface 199 of the wafer and the backside of the insulating layer 101.

In order to reduce (e.g., minimize) thermal stresses on the silicon wafer 100, the high TC material which is formed in the opening 125 (e.g., the material in layer 135 which may fill the backside of the wafer), may have a CTE which is substantially the same as (e.g., matches) the CTE of silicon. That is, the high TC material may have a CTE in the range from about 4 ppm/k to about 7 ppm/k (As noted above, if the wafer 100 includes a semiconductor substrate other than silicon (e.g., germanium), the high TC material should have a CTE which is substantially the same (e.g., matches) the CTE of that substrate).

In addition to aluminum and copper, other materials having a CTE which is similar to (e.g., matched with) the CTE of silicon include nickel-iron alloys, and blends of copper and tungsten (Cu—W) and copper and molybdenum (Cu—Mo). In addition, there are a number of composite materials which have CTEs in the desired range. For example, silicon carbide particle-reinforced aluminum ([SiC]p/Al), carbon fiber-reinforced copper (C/Cu), carbon fiber-reinforced aluminum (C/Al), diamond particle-reinforced copper ([Diamond]p/Cu), and beryllia particle-reinforced beryllium ([BeO]p/Be), pyrolitic graphite, carbon/carbon (C/C) composites, carbon fiberreinforced epoxy (C/Ep) and CVD diamond. Among them, carbon fibers have nominal thermal conductivities as high as 1100 W/m K.

In the present invention, the use of porous silicon is aimed at mitigating a thermal stress in the wafer especially when the high TC material is a material (e.g., a composite material) formed of different materials having different CTEs. When the high TC material diffuses into the porous silicon, the CTE of the mixed (e.g., composite) material will have a better thermal match with the silicon than the high TC material alone.

Figure 14:
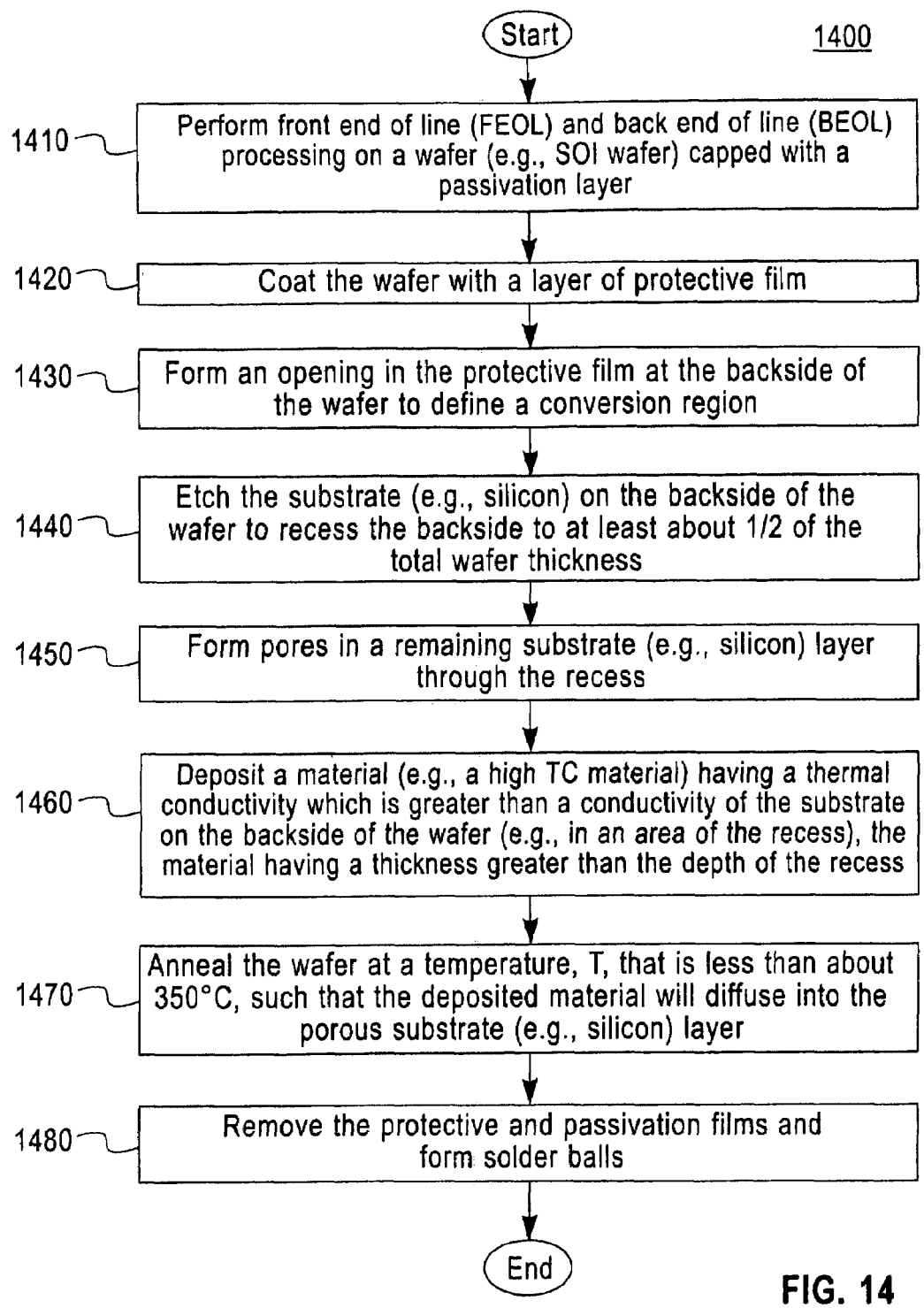
FIG. 14 provides a process flow chart illustrating a method 1400 of fabricating a semiconductor device according to an exemplary aspect of the present invention.

FIG. 14 provides a process flow chart illustrating a method 1400 of fabricating a semiconductor device according to an exemplary aspect of the present invention As illustrated in FIG. 14, the method 1400 may include performing (1410) FEOL and BEOL processing on a wafer (e.g., SOI wafer) capped with a passivation layer, coating (1420) the wafer with a layer of protective film, forming (1430) an opening in the protective film at the backside of the wafer to define a conversion region, etching (1440) the substrate (e.g., silicon) on the backside of the wafer to recess the backside to at least about ½ of the total wafer thickness, forming (1450) pores in a remaining substrate (e.g., silicon) layer through the recess, depositing (1460) a material (e.g., a high TC material) having a thermal conductivity which is greater than a conductivity of the substrate on the backside of the wafer (e.g., in an area of the recess), the material having a thickness greater than the depth of the recess, annealing (1470) at a temperature, T, that is less than 350° C., such that the deposited material will diffuse into the porous substrate (e.g., porous silicon) layer, and stripping (1480) away the protective and passivation films and forming solder balls (e.g., C4 balls).

It should be noted that FIG. 14 is not intended to be limiting. That is, there may be variations of the method 1400 which are based on the same principle as the present invention. For example, in another exemplary aspect of the present invention, to reduce on-chip thermal resistance, the layer 135 of high TC material may be formed in the opening 125 on the backside of a wafer, without forming the interdiffusion layer 170 (e.g., the porous silicon buffer layer). In another exemplary aspect, the high TC material in layer 135 may diffuse completely (e.g., entirely) into the porous silicon such that none of the layer 135 remains after the diffusion. That is, there may be many variations of the present invention which can be used to curtail the thermal resistance on the chip.

It is also an important aspect of the present invention, that in forming the pores 130 in the remaining silicon, dopant ions (e.g., boron ions) may be implanted in the remaining silicon such that a dopant concentration gradient is formed between an area of low dopant concentration (e.g., near the barrier layer 180) and an area of high dopant concentration (e.g., near the high TC material 135). When the pores 130 are formed (e.g., by anodic etching) the pore density (e.g., porosity) will vary based on the dopant concentration (e.g., from an area of low pore density near the barrier layer 180 to an area of high pore density near the high TC material 135).

As a result, when the high TC material is diffused into the porous material region 170, the ratio of silicon:high TC material in the region 170 may decrease in a direction toward the high TC material layer 135. That is, the silicon: high TC material ratio in the alloy of the interdiffusion layer 170 may vary from a high silicon:high TC material ratio to a low silicon:high TC material ratio near the high TC material layer 135.

Therefore, the resulting alloy in the interdiffusion region 170 may have a CTE which may vary (e.g., in a thickness direction of the wafer) depending on the ratio of two materials in the resulting alloy. Specifically, the CTE of the interdiffusion region 170 may vary from a CTE which is at least substantially equal to the CTE of the substrate (e.g., silicon) (e.g., in an area near the barrier layer 180) to a CTE which is at least substantially equal to that of the high TC material (e.g., in an area near the high TC material layer 135).

Thus, it is an important aspect of the present invention that the wafer can have a higher porosity (e.g., pore density) towards the back surface of the wafer and a lower porosity (e.g., pore density) towards the front end of the wafer, such that after diffusion of the high TC material (e.g., metal) to form the interdiffusion layer 170, the front end of wafer will have higher density of substrate (e.g., silicon) and the back end of the wafer has higher density of the high TC material, to progressively (e.g., gradually) change the CTE of the wafer in the thickness direction of the wafer.

In short, in an exemplary aspect of the present invention, when the wafer has finished the FEOL and BEOL processes, at least a portion of its thickness on the backside of the wafer may be converted into a high-thermal conductive material. The final wafer thickness may be substantially the same as the thickness of the original wafer (e.g., the wafer before beginning the conversion process).

A porous substrate (e.g., silicon) layer may be prepared so that the converted material can diffuse into this layer to form silicide, alloy or composite material with a matched CTE of the substrate (e.g., silicon). The buried oxide layer of a semiconductor substrate (e.g., an SOI substrate) may be used as the conversion stop layer so that the circuits and interconnects on the front-side of the wafer will not be affected by the conversion process.

Candidates of high-thermal conductive material to convert include: aluminum, gold, copper, blends of copper and tungsten (Cu—W), copper and molybdenum (Cu—Mo), silicon carbide particle-reinforced aluminum ([SiC]p/Al), carbon fiber-reinforced copper (C/Cu), carbon fiber-reinforced aluminum (C/Al), diamond particle-reinforced copper ([Diamond]p/Cu), and beryllia particle-reinforced beryllium ([BeO]p/Be), pyrolitic graphite, carbon/carbon (C/C) composites, carbon fiber-reinforced epoxy (C/Ep) and CVD diamond, etc.

Some of the advantages of the present invention include, but by no means are limited to 1) the wafer has a higher mechanical strength compared to a thinned die, 2) the wafer includes an excellent thermal conductivity (e.g., the thermal flow efficiency in the wafer is significantly improved), 3) the conversion process is straight-forward and high-yield reducing costs, and 4) if a metal is used as the high TC material, it can also serve as a ground plate for the chip to reduce on-chip noise.

Other Aspects

Figure 15A:
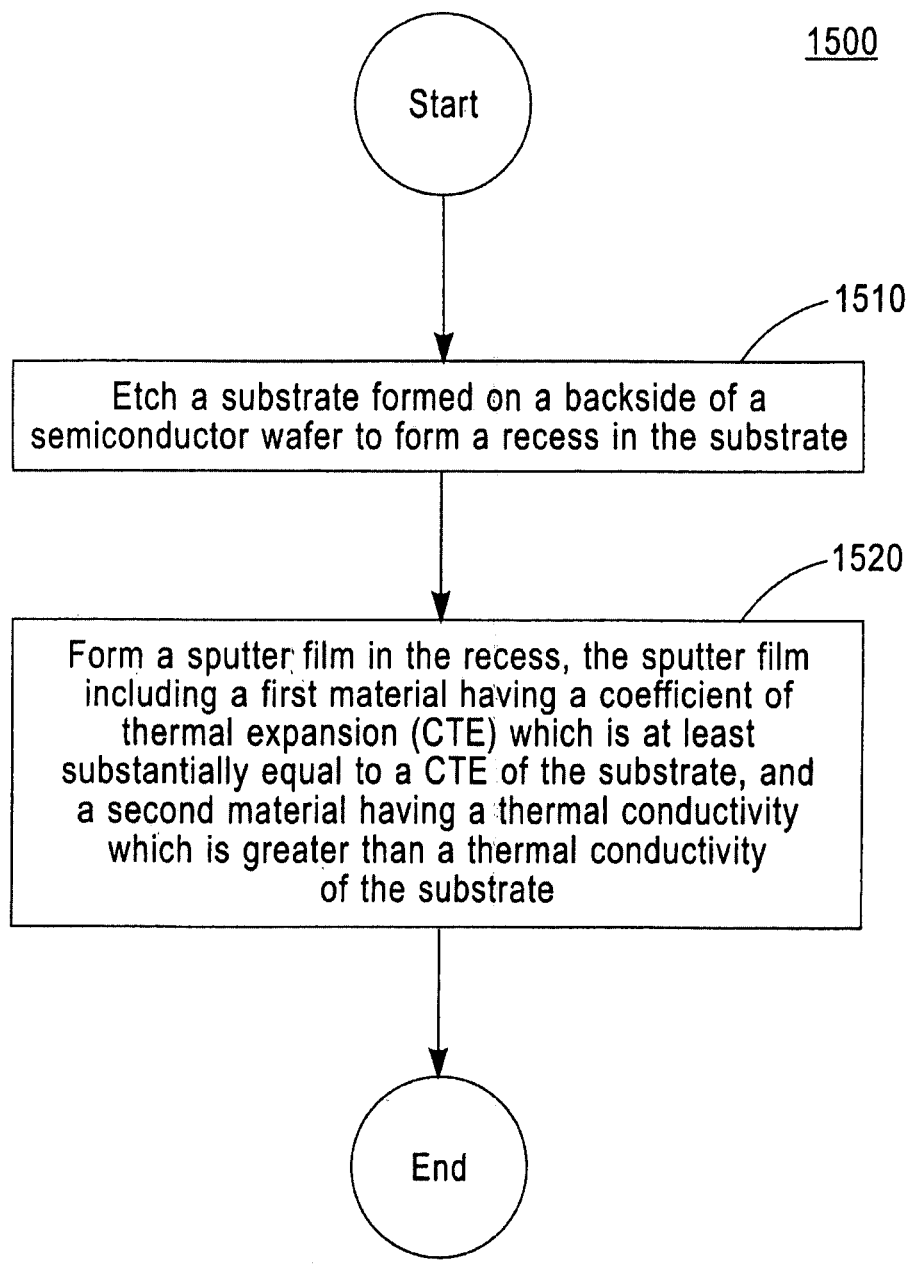
FIG. 15A provides a flow chart illustrating a method 1500 of fabricating a semiconductor device according to the exemplary aspects of the present invention.
Figure 15B:
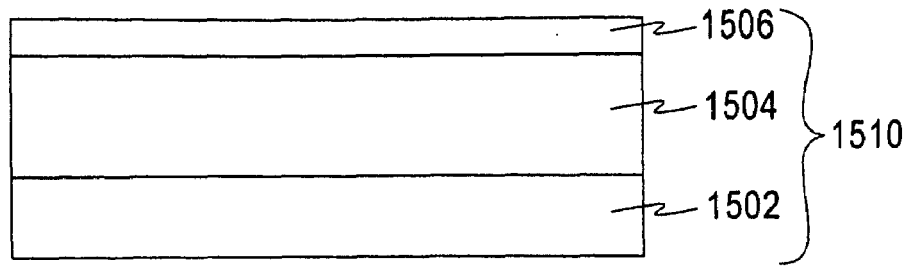
FIG. 15B illustrates a sputter film 1510 which may be used in the method 1500 of fabricating a semiconductor device according to the exemplary aspects of the present invention.
Figure 15C:
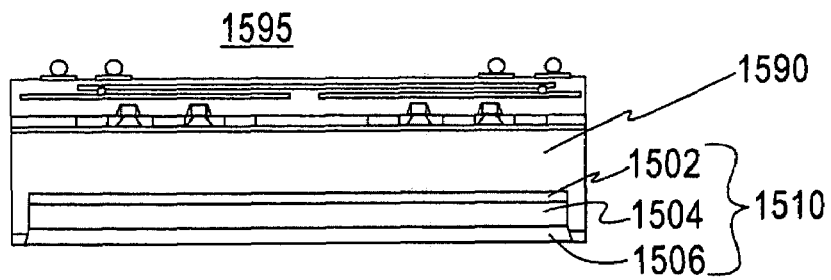
FIG. 15C illustrates a semiconductor device 1595 which may be fabricated using the method 1500 according to the exemplary aspects of the present invention.

FIGS. 15A-15C illustrate another exemplary aspect of the present invention. As illustrated in FIG. 15A, a method 1500 of fabricating a semiconductor device (e.g., a wafer backside conversion method) includes removing 1510 a portion of a semiconductor substrate (e.g., silicon substrate formed on the backside of a wafer), and depositing 1520 a sputter film after a portion of substrate is removed. Specifically, the sputter film may be deposited in an area of the substrate where the portion was removed.

FIG. 15B illustrates a sputter film 1510 which may be used in this exemplary aspect of the present invention. The sputter film 1510 may include a layer 1502 (e.g., a semiconductor layer such as a silicon layer), layer 1504 (e.g., a graded material layer which may include a semiconductor and a metal) and a layer 1506 (e.g., a metal layer).

The sputter film may be sputtered at a low temperature and start with a first material (e.g., a semiconductor such as silicon) having a coefficient of thermal expansion (CTE) which is at least substantially equal to (e.g., 100% matched) the CTE of the substrate 1590 (e.g., silicon) and gradually decrease in first material (e.g., silicon) content and gradually increase in content of a second material (e.g., a high thermal conductivity material such as a metal) having a thermal conductivity that is higher than the thermal conductivity of the substrate 1590 such that the layer 1506 may be substantially entirely formed of the high thermal conductivity material. That is, a first portion of the sputter film may include a concentration of the first material which is greater than a concentration of the second material, a second portion of the sputter film may include a concentration of the second material which is greater than a concentration of the first material, and a third portion of the sputter film may be formed between the first and second portions and include a graded portion which may gradually transition between the first and second portions. For example, in an exemplary aspect of the present invention, the sputter film 1510 includes a layer 1502 which is 100% silicon, a layer 1506 which is 100% Aluminum, and a layer 1504 which includes silicon and aluminum and gradually transitions (e.g., in the direction of the aluminum layer 1506) from a high silicon/low aluminum content to a low silicon/high aluminum content.

FIG. 15C illustrates a semiconductor device 1595 according to this exemplary aspect of the present invention. The device 1595 includes the sputter film 1510 but otherwise may be similar in construction to the device 100 discussed above and illustrated, for example, in FIG. 13. It should be noted that the device 1595 does not necessarily include a porous material film as illustrated in FIG. 15C. It should also be noted that the method of fabricating the device 1595 may be similar to the method of fabricating the device 100, and therefore, the discussion above with respect to the device 100 and the method of fabricating the device 100 are incorporated herein by reference.

Figure 15D:
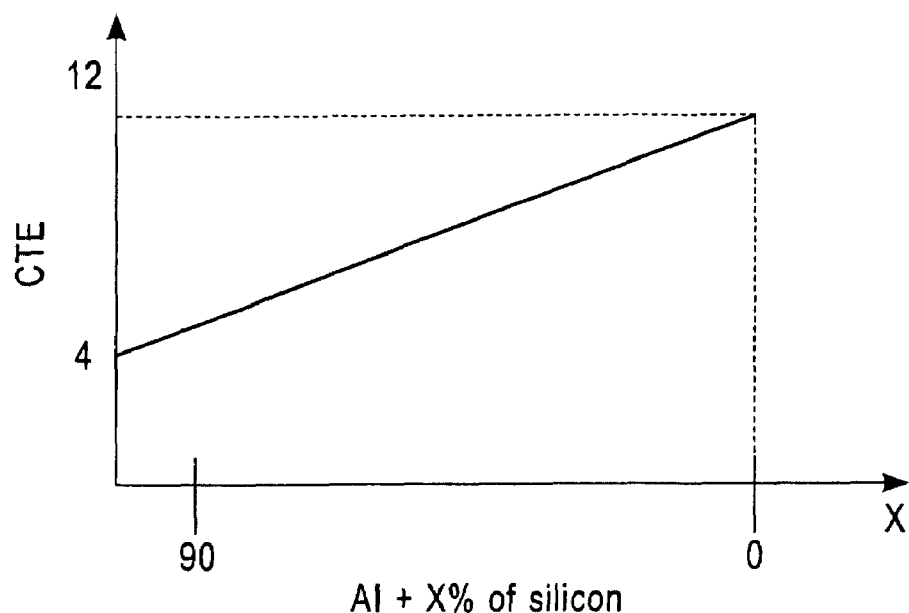
FIG. 15D provides a CTE diagram for a sputter film 1510 according to the exemplary aspects of the present invention.

FIG. 15D provides a CTE diagram for a sputter film according to this exemplary aspect of the present invention. The diagram plots the CTE of the sputter film vs. the percentage (X) of first material (e.g., silicon) in the sputter film. As illustrated in the diagram, as the percentage of first material (e.g., silicon) decreases in the sputter film from 100% to 0%, the CTE for the sputter film increases from about 4 to about 12.

In short, the sputter film at the interface with the substrate 1590 on the backside of the wafer may include a material (e.g., silicon) which has a CTE which is at least substantially equal to that of the substrate on the wafer backside. For example, the film may have a high concentration of silicon and then gradually transition to pure metal when it reaches to its full thickness which is sufficient to provide mechanical strength.

In addition, a thin layer of metal may be deposited on the backside of the wafer after the formation of the sputter film (e.g., to increase mechanical strength, thermal conductivity, etc.).

This exemplary aspect of the present invention is different from the other aspect (e.g., the aspect having a metal coated at the backside) at least in that (1) the layer of first material (e.g., the silicon layer) may be more significantly reduced in this aspect, and (2) this aspect may provide a graded material with a CTE matched interface at the substrate (e.g., silicon) end and CTE matched surface to a metal heat sink (e.g., which may be mounted on the device later).

With its unique and novel features, the present invention provides a wafer (e.g., semiconductor chip) which is relatively inexpensive, has a high mechanical strength, and has an easily controllable thickness.

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

For example, it should be noted that the present invention is not necessarily limited to use of a backside of an SOI wafer. That is, although the examples described herein may use an SOI wafer, the present invention may also be used on other semiconductor substrates such as a bulk silicon substrate (e.g., bulk silicon wafer) or a bulk germanium substrate.

Further, Applicant's intent is to encompass the equivalents of all claim elements, and no amendment to any claim the present application should be construed as a disclaimer of any interest in or right to an equivalent of any element or feature of the amended claim.

The invention claimed is:

1. A method of fabricating a semiconductor device, comprising:
    etching a substrate to form a recess, the substrate being formed on a backside of a semiconductor wafer;
    forming pores in said substrate in an area of said recess; and
    forming in said recess a material having a thermal conductivity which is greater than a thermal conductivity of said substrate.

2. The method of claim 1, further comprising:
    annealing said device such that said material diffuses into said pores,
    wherein a portion of said substrate which includes said diffused material has a coefficient of thermal expansion (CTE) which is substantially equal to a CTE of said substrate.

3. The method of claim 1, further comprising:
    forming a protective coating on said substrate, said protective coating inhibiting damage to a device formed in said substrate during said forming said pores in said substrate.

4. The method of claim 3, further comprising:
    etching said protective coating to form an opening in said protective coating, said etching said substrate being performed through said opening.

5. The method of claim 1, wherein said wafer includes a silicon-on-insulator wafer including a buried insulating layer which functions as a conversion stop layer in said forming said pores.

6. The method of claim 5, wherein said material diffuses into said pores to form an interdiffusion layer between said recess and said buried insulating layer.

7. The method of claim 6, wherein said interdiffusion layer includes a coefficient of thermal expansion (CTE) which is at least substantially equal to a CTE of said substrate at a region of said interdiffusion layer which is nearest said buried insulating layer, said CTE of said interdiffusion layer increasing in a direction toward said backside of said wafer.

8. The method of claim 6, further comprising:
    a barrier layer formed on a backside of said buried insulating layer which functions as a conversion stop layer,
    wherein a thickness of a frontside of said wafer between an uppermost surface of said wafer and said barrier layer is in a range from about 10 to about 20% of a total thickness of said wafer, said interdiffusion layer comprises a thickness in a range from about 10 to about 20% of a total thickness of said wafer, and said material comprises a layer having a thickness in a range from about 60 to about 80% of a total thickness of said wafer.

9. The method of claim 1, wherein said forming said pores includes implanting ions in said substrate in said area of said recess, a density of said pores being dependent upon an impurity doping concentration.

10. The method of claim 9, wherein said pore density increases in a direction toward said backside of said wafer.

11. The method of claim 1, wherein said etching said substrate includes reducing an original thickness of a wafer including said substrate by about one-half.

12. The method of claim 11, wherein after said forming said material, a total thickness of said wafer is at least substantially the same as said original thickness.

13. The method of claim 1, wherein said forming said material includes a low-temperature process including at least one of annealing, inter-diffusion, plating and silicidation.

14. The method of claim 1, wherein said forming said pores includes anodic etching in a fluoride-containing, acidic electrolyte in which said wafer including said substrate is connected as an anode.

15. The method of claim 1, wherein said material includes at least one of copper, aluminum, gold, tungsten, diamond and silicon carbide.

16. The method of claim 1, wherein said material includes at least one of aluminum, copper, gold, blends of copper and tungsten (Cu—W), copper and molybdenum (Cu—Mo), silicon carbide particle-reinforced aluminum ([SiC]p/Al), carbon fiber-reinforced copper (C/Cu), carbon fiber-reinforced aluminum (C/Al), diamond particle-reinforced copper ([Diamond]p/Cu), and beryllia particle-reinforced beryllium ([BeO]p/Be), pyrolitic graphite, carbon/carbon (C/C) composites, carbon fiber-reinforced epoxy (C/Ep) and chemical vapor deposition (CVD) diamond.

* * * * *